United States Patent
Okada

(10) Patent No.: US 8,427,732 B2
(45) Date of Patent: Apr. 23, 2013

(54) UNCOOLED OPTICAL SEMICONDUCTOR DEVICE

(75) Inventor: Norio Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/196,946

(22) Filed: Aug. 3, 2011

(65) Prior Publication Data

US 2012/0162743 A1    Jun. 28, 2012

(30) Foreign Application Priority Data

Dec. 28, 2010 (JP) ................. 2010-291862

(51) Int. Cl.
*G02F 1/07* (2006.01)
*G02F 1/00* (2006.01)
*H01S 3/00* (2006.01)

(52) U.S. Cl.
USPC ............... 359/248; 359/237; 372/38.02

(58) Field of Classification Search ............ 359/237, 359/238, 245, 248, 254; 372/38.01, 38.02, 372/38.05, 38.1
See application file for complete search history.

(56) References Cited

U.S. PATENT DOCUMENTS 7,061,950 B2   6/2006  Hongo et al.
7,809,038 B2   10/2010 Makino

FOREIGN PATENT DOCUMENTS

| JP | 10-117170 A | 5/1998 |
| JP | 2000-292756 A | 10/2000 |
| JP | 2004-61556 A | 2/2004 |
| JP | 2007-279406 A | 10/2007 |

*Primary Examiner* — Tuyen Tra
(74) *Attorney, Agent, or Firm* — Leydig, Voit & Mayer, Ltd.

(57) ABSTRACT

An uncooled optical semiconductor device includes: a semiconductor laser outputting laser light; an electric field absorption optical modulator absorbing light depending on a voltage applied to the electric field absorption optical modulator; a monitor photodiode monitoring backlight of the semiconductor laser; an auto power control circuit feeding back current of the monitor photodiode to a bias current supplied to the semiconductor laser; and a bias circuit feeding back an average value of a light absorption current to control a bias voltage applied to the electric field absorption optical modulator. The light absorption current is generated when the electric field absorption optical modulator absorbs the laser light.

4 Claims, 3 Drawing Sheets

UNCOOLED OPTICAL SEMICONDUCTOR DEVICE

BACKGROUND OF THE INVENTION

1. Field of the Invention

The present invention relates to an uncooled optical semiconductor device which can accurately control the bias voltage of the electric field absorption type optical modulator so as to keep constant the average intensity of the optical modulated signal in a simple configuration.

2. Background Art

The amount of light absorbed by an electric field absorption type optical modulator varies depending on the temperature even when a voltage applied is constant. For this reason, an uncooled optical semiconductor device not subjected to cooling for keeping its temperature constant needs to adjust a bias voltage applied to the electric field absorption type optical modulator according to the temperature.

Conventional uncooled optical semiconductor devices predetermine a bias voltage to be applied to an electric field absorption type optical modulator for a certain temperature beforehand through testing or the like. The semiconductor devices perform control so that a bias voltage matches the temperature through a microcontroller or the like while monitoring the temperature using a temperature sensor (e.g., see Japanese Patent Laid-Open No. 2007-279406).

Furthermore, an optical semiconductor device is also proposed which detects a peak value of a light absorption current generated when an electric field absorption type optical modulator absorbs laser light and feeds back the peak value to a bias voltage applied to the electric field absorption type optical modulator (e.g., see Japanese Patent Laid-Open No. 10-117170).

SUMMARY OF THE INVENTION

The device described in Japanese Patent Laid-Open No. 2007-279406 requires a temperature test of the electric field absorption type optical modulator beforehand. An optical transmitter/receiver incorporating the same also needs writing of its microcontroller. Furthermore, the bias voltage to be applied to the electric field absorption type optical modulator may not be calculated correctly due to a difference or the like between the temperature monitored by the temperature sensor and the temperature of the electric field absorption type optical modulator.

The device described in Japanese Patent Laid-Open No. 10-117170 compares a high-level voltage and a peak value of the light absorption current and attempts to keep the light absorption current constant. This requires peak detection of the modulation voltage of a driver circuit and makes the configuration complicated. Moreover, the peak detection is error-prone.

In view of the above-described problems, an object of the present invention is to provide an uncooled optical semiconductor device which can accurately control the bias voltage of the electric field absorption type optical modulator so as to keep constant the average intensity of the optical modulated signal in a simple configuration.

According to the present invention, an uncooled optical semiconductor device comprises: a semiconductor laser outputting laser light; an electric field absorption type optical modulator wherein an amount of light absorbed by the electric field absorption type optical modulator varies depending on voltage applied to the electric field absorption type optical modulator; a monitor photodiode monitoring backlight of the semiconductor laser; an auto power control circuit feeding back a received current of the monitor photodiode to a bias current supplied to the semiconductor laser; and a bias circuit feeding back an average value of a light absorption current to bias voltage applied to the electric field absorption type optical modulator, wherein the light absorption current is generated when the electric field absorption type optical modulator absorbs the laser light.

The present invention makes it possible to accurately control the bias voltage of the electric field absorption type optical modulator so as to keep constant the average intensity of the optical modulated signal in a simple configuration.

Other and further objects, features and advantages of the invention will appear more fully from the following description.

DETAILED DESCRIPTION OF THE PREFERRED EMBODIMENTS

An uncooled optical semiconductor device according to the embodiments of the present invention will be described with reference to the drawings. The same components will be denoted by the same symbols, and the repeated description thereof may be omitted.

First Embodiment

Figure 1:
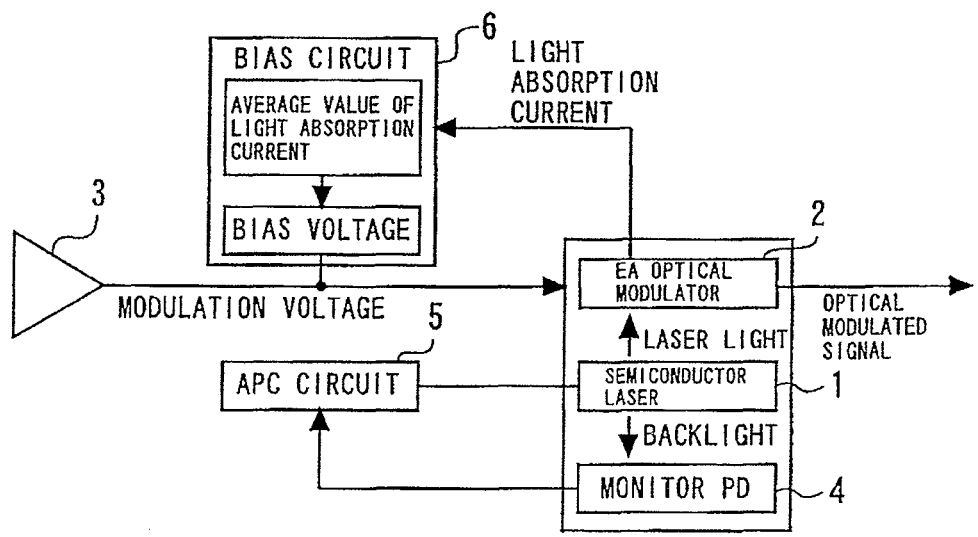
FIG. 1 is a diagram illustrating an uncooled optical semiconductor device according to a first embodiment of the present invention.

FIG. 1 is a diagram illustrating an uncooled optical semiconductor device according to a first embodiment of the present invention. A semiconductor laser 1 outputs laser light. An electric field absorption type optical modulator 2 absorbs and modulates the laser light and outputs an optical modulated signal. A driver circuit 3 applies a modulation voltage to the electric field absorption type optical modulator 2. The amount of the laser light absorbed by the electric field absorption type optical modulator 2 varies depending on the voltage applied to the electric field absorption type optical modulator 2. A light absorption current is generated when the electric field absorption type optical modulator 2 absorbs the laser light.

A monitor photodiode 4 monitors backlight of the semiconductor laser 1. An APC (Auto Power Control) circuit 5 feeds back the received current of the monitor photodiode 4 to a bias current supplied to the semiconductor laser 1. That is, the APC circuit 5 controls the bias current so as to keep constant the received current of the monitor photodiode 4.

Therefore, once power of the laser light inputted from the semiconductor laser 1 to the electric field absorption type optical modulator 2 is set at a certain temperature, the power is kept constant even when the temperature fluctuates.

A bias circuit 6 applies a bias voltage to the electric field absorption type optical modulator 2. In that case, the bias circuit 6 smoothes the light absorption current of the electric field absorption type optical modulator 2, detects an average value thereof and feeds back the average value to the bias voltage applied to the electric field absorption type optical modulator 2. Therefore, the bias circuit 6 controls the bias voltage so as to keep constant the average value of the light absorption current.

Figure 2:
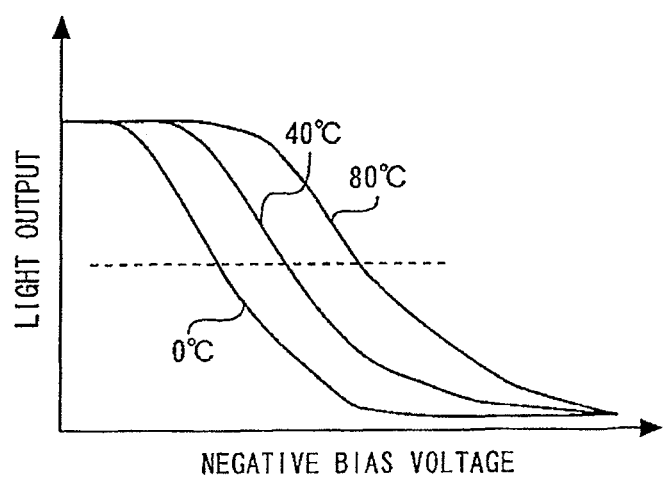
FIG. 2 is a diagram illustrating an example of the relationship between a negative bias and the light output of the electric field absorption type optical modulator.
Figure 3:
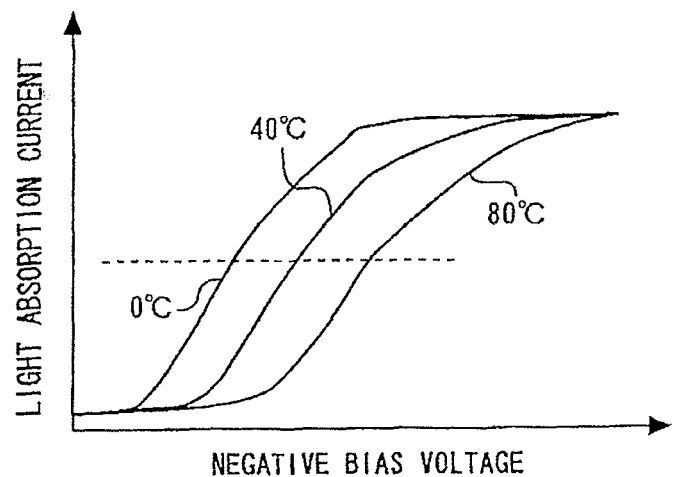
FIG. 3 is a diagram illustrating an example of the relationship between the negative bias of the electric field absorption type optical modulator and the light absorption current.

Next, the effects of the present embodiment will be described. FIG. 2 is a diagram illustrating an example of the relationship between a negative bias and the light output of the electric field absorption type optical modulator. FIG. 3 is a diagram illustrating an example of the relationship between the negative bias of the electric field absorption type optical modulator and the light absorption current. At 0° C., light is absorbed even when the negative bias is small, but at 80° C., light is less absorbed unless the negative bias is increased. This phenomenon generally occurs because light absorption characteristics of the electric field absorption type optical modulator have a strong wavelength dependency and the wavelength of incident light changes as the temperature changes.

Thus, the relationship between the amount of light absorption and the negative bias of the electric field absorption type optical modulator 2 changes according to the temperature. Therefore, the present embodiment feeds back the light absorption current of the electric field absorption type optical modulator 2 to the bias voltage. Therefore, when the bias voltage is set at a certain temperature, it is kept constant even if the temperature changes thereafter. It is thereby possible to keep constant the amount of light absorption of the electric field absorption type optical modulator 2 irrespective of the temperature.

However, the light absorption current of the electric field absorption type optical modulator 2 is modulated according to the modulation voltage. Therefore, the present embodiment detects an average value of the light absorption current and feeds back the average value to the bias voltage. This makes it possible to keep constant average intensity of the light modulated signal outputted from the electric field absorption type optical modulator 2.

Furthermore, it is not necessary to perform microcontroller control so as to obtain an optimum bias voltage for each temperature and all that is required is to directly feed back the average value of the light absorption current to the bias voltage, which makes the configuration quite simple. Detection of an average value of the light absorption current is more error-resistant than detection of a peak value of the light absorption current.

Therefore, the uncooled optical semiconductor device according to the present embodiment can accurately control the bias voltage of the electric field absorption type optical modulator so as to keep constant the average intensity of the optical modulated signal in a simple configuration.

Second Embodiment

Figure 4:
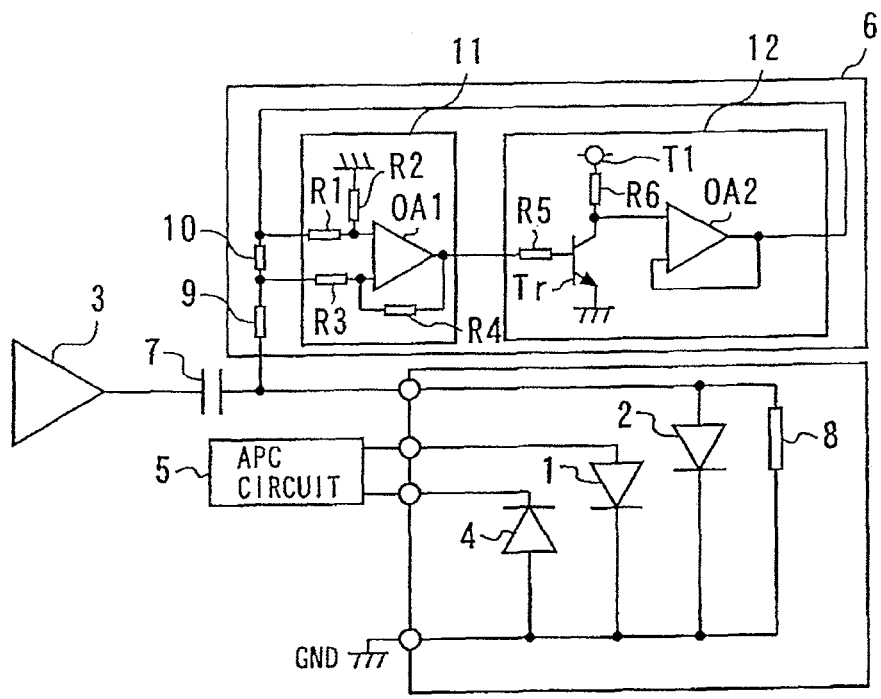
FIG. 4 is a diagram illustrating an uncooled optical semiconductor device according to a second embodiment of the present invention.

FIG. 4 is a diagram illustrating an uncooled optical semiconductor device according to a second embodiment of the present invention. A driver circuit 3 is connected to an anode of an electric field absorption type optical modulator 2 via a capacitor 7. A matching resistor 8 is connected in parallel to the electric field absorption type optical modulator 2.

A bias circuit 6 includes an inductor 9, a resistor 10, a differential amplification circuit 11 and an inverting amplification circuit 12. The inductor 9 may be a resistor or coil. One end of the inductor 9 is connected to the anode of the electric field absorption type optical modulator 2. One end of the resistor 10 is connected to the other end of the inductor 9. The differential amplification circuit 11 includes an operational amplifier OA1 and resistors R1, R2, R3 and R4. The inverting amplification circuit 12 includes an emitter grounded circuit made up of resistors R5 and R6, a transistor Tr and a terminal T1, and a voltage follower circuit made up of an operational amplifier OA2. An initial value of an offset voltage is given to the terminal T1.

Next, operation of the bias circuit 6 will be described. The inductor 9 cuts an AC component and the capacitor 7 cuts a DC component from the driver circuit 3. Impedance of a signal line is generally matched at 50Ω and therefore it is possible to cut the AC component by making the impedance of the inductor 9 sufficiently greater than 50Ω with respect to the AC component. For example, the impedance of the inductor 9 is set to 1 kΩ or greater (20 times 50Ω or more). This causes the current flowing into the bias circuit 6 to be only the component from the electric field absorption type optical modulator 2 side.

A potential difference is generated between both ends of the resistor 10 by a light absorption current flowing from the electric field absorption type optical modulator 2. The differential amplification circuit 11 amplifies this potential difference, for example, ten-fold. When the output voltage of the differential amplification circuit 11 decreases, a voltage drop by the transistor Tr decreases, and therefore the output voltage of the inverting amplification circuit 12 increases. Therefore, the differential amplification circuit 11 and the inverting amplification circuit 12 apply a greater negative bias to the other end of the resistor 10 as the potential difference between both ends of the resistor 10 decreases. Thus, when the light absorption current increases, the negative bias approaches 0 V. On the contrary, when the light absorption current decreases, the negative bias increases. As a result, the bias circuit 6 operates so as to keep constant the light absorption current. Furthermore, since the inductor 9 and the resistor 10 smooth the light absorption current, an average value of the light absorption current is detected.

A current having a value after dividing the negative bias by the resistance value of the matching resistor 8 flows into the bias circuit 6 together with the light absorption current. However, since the current by this matching resistor 8 generally includes almost no temperature variation, the current does not affect the operation. Since the matching resistor 8 creates a modulation voltage amplitude using the product with the modulation current from the driver circuit 3, there is no problem if the resistance is greater than 0Ω.

Third Embodiment

Figure 5:
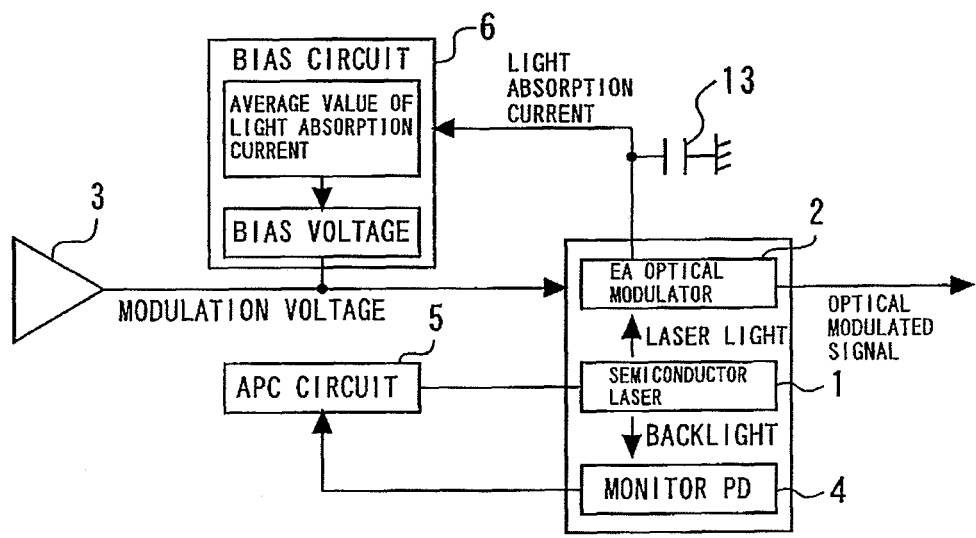
FIG. 5 is a diagram illustrating an uncooled optical semiconductor device according to a third embodiment of the present invention.

FIG. 5 is a diagram illustrating an uncooled optical semiconductor device according to a third embodiment of the present invention. This corresponds to the configuration of the first embodiment further provided with a capacitor 13. One end of the capacitor 13 is connected to a connection point between the electric field absorption type optical modulator 2 and the bias circuit 6 and the other end of the capacitor 13 is connected to GND.

When power is turned on, if the bias circuit 6 stabilizes before the APC circuit 5 stabilizes, the device attempts to keep constant the light absorption current while power of laser light inputted to the electric field absorption type optical modulator 2 is unstable, and therefore the operation becomes unstable.

Therefore, the present embodiment uses the capacitor 13 to delay a time constant of the feedback operation of the bias circuit 6. Therefore, when power is turned on, the bias circuit 6 stabilizes later than the APC circuit 5 stabilizes. This causes the device to keep constant the light absorption current while power of the laser light inputted to the electric field absorption type optical modulator 2 is stable, and thereby stabilizes the operation.

Similar effects can also be obtained by turning on the bias circuit 6 after the APC circuit 5 through a power supply sequence instead of providing the capacitor 13.

Fourth Embodiment

Figure 6:
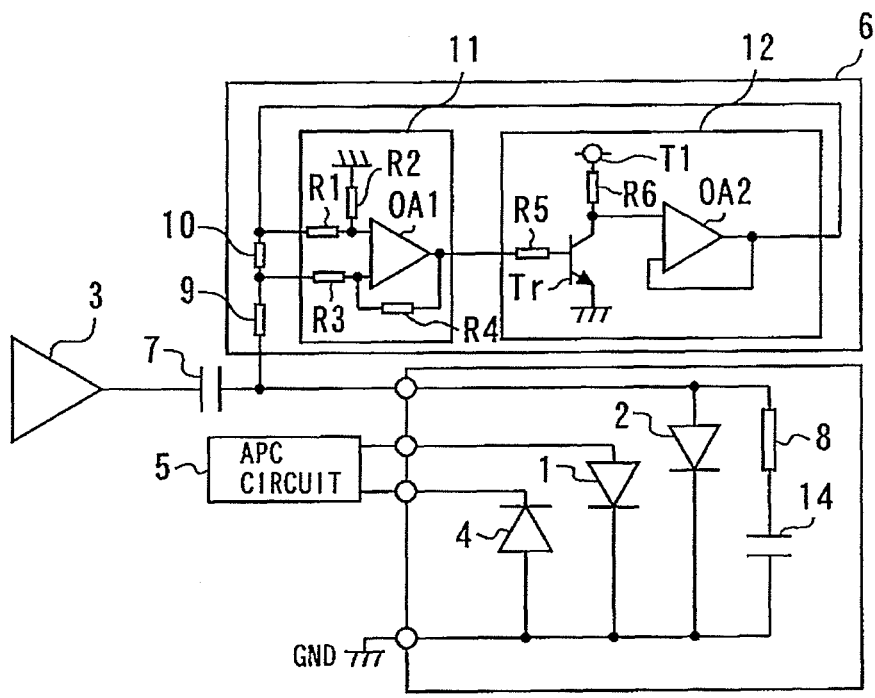
FIG. 6 is a diagram illustrating an uncooled optical semiconductor device according to a fourth embodiment of the present invention.

FIG. 6 is a diagram illustrating an uncooled optical semiconductor device according to a fourth embodiment of the present invention. This corresponds to the configuration of the second embodiment provided with a capacitor 14. The capacitor 14 is connected between a matching resistor 8 and GND. Since the capacitor 14 cuts a DC component from the matching resistor 8, only a light absorption current flows into the bias circuit 6. Therefore, it is possible to more accurately control a bias voltage of the electric field absorption type optical modulator.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-291862, filed on Dec. 28, 2010 including specification, claims, drawings and summary, on which the Convention priority of the present application is based, are incorporated herein by reference in its entirety.

What is claimed is:

1. An uncooled optical semiconductor device comprising:
    a semiconductor laser outputting laser light in response to a current supplied to the semiconductor laser;
    an electric field absorption optical modulator on which the laser light is incident, wherein the electric field absorption optical modulator
        has an anode and a cathode,
        modulates the laser light by absorption of the laser light in a quantity that varies with a bias voltage applied to the electric field absorption optical modulator, and
        generates a light absorption current in response to the bias voltage applied and the absorption of the laser light;
    a monitor photodiode monitoring and detecting backlight emitted by the semiconductor laser and producing a photocurrent in response to the backlight detected;
    an auto power control circuit responding to the backlight detected by the monitor photodiode by feeding back to the semiconductor laser a current produced in response to the photocurrent, independent of temperature of the semiconductor laser; and
    a bias circuit feeding back to the electric field absorption optical modulator an average value of the light absorption current and thereby controlling a bias voltage applied to the electric field absorption optical modulator, irrespective of temperature of the electric field absorption optical modulator.

2. The uncooled optical semiconductor device according to claim 1, wherein the bias circuit includes:
    an inductor having a first end connected to the anode of the electric field absorption optical modulator;
    a resistor having a first end connected to a second end of the inductor; and
    a circuit applying a greater negative bias to the second end of the resistor as potential difference between the first and second ends of the resistor decreases.

3. The uncooled optical semiconductor device according to claim 1, including a grounded capacitive element connected to the electric field absorption optical modulator and to the bias circuit so that the bias circuit stabilizes later than the auto power control circuit stabilizes, when power is turned on.

4. The uncooled optical semiconductor device according to claim 1, further comprising:
    a matching resistor connected in parallel with the electric field absorption optical modulator; and
    a capacitor connected in series with the matching resistor, between the matching resistor and ground, with the matching resistor and the capacitor connected in parallel with the electric field absorption optical modulator, wherein the capacitor blocks direct current flow through the matching resistor to ground, thereby improving accuracy of the bias voltage generated by the bias circuit and applied to the electric field absorption optical modulator.

* * * * *